United States Patent [19]
Jung et al.

[11] Patent Number: 4,706,811
[45] Date of Patent: Nov. 17, 1987

[54] SURFACE MOUNT PACKAGE FOR ENCAPSULATED TAPE AUTOMATED BONDING INTEGRATED CIRCUIT MODULES

[75] Inventors: James E. Jung, Westfield; Mark A. Koors; Phillip A. Lutz, both of Kokomo, all of Ind.

[73] Assignee: General Motors Corporation, Detroit, Mich.

[21] Appl. No.: 835,199

[22] Filed: Mar. 3, 1986

[51] Int. Cl.$^4$ .............................................. B65D 73/02
[52] U.S. Cl. ................................ 206/331; 174/57 FP
[58] Field of Search .............................. 206/331, 332; 174/52 FP, 52 R; 357/70, 69

[56] References Cited

U.S. PATENT DOCUMENTS

| | | | |
|---|---|---|---|
| 3,746,157 | 7/1973 | I'Anson | 206/331 |
| 3,823,350 | 7/1974 | Stoner | 317/234 |
| 3,950,603 | 11/1976 | Brefka | 174/52 |
| 4,195,193 | 3/1980 | Grabbe et al. | 174/52 |
| 4,209,798 | 6/1980 | Beretta | 357/70 |
| 4,330,683 | 5/1982 | Parker | 174/52 |
| 4,585,121 | 4/1986 | Capelle, Jr. | 206/331 |
| 4,615,441 | 10/1986 | Nakamura | 206/331 |

Primary Examiner—Joseph Man-Fu Moy
Attorney, Agent, or Firm—Randy W. Tung

[57] ABSTRACT

A surface mount package formed by nesting an encapsulated tape automated bonding integrated circuit module in between two plastic rings snapped together.

3 Claims, 15 Drawing Figures

SURFACE MOUNT PACKAGE FOR ENCAPSULATED TAPE AUTOMATED BONDING INTEGRATED CIRCUIT MODULES

FIELD OF THE INVENTION

The present invention generally relates to a surface mount package of an encapsulated tape automated bonding integrated circuit module and, more particularly, is concerned with a surface mount package formed by nesting an encapsulated tape automated bonding integrated circuit module in between two plastic rings snapped together.

BACKGROUND OF THE INVENTION

In recent years, techniques of using a tape automated bonding process (generally referred to as the TAB process) to package integrated circuit chips have been developed. The TAB process replaces other lead-frame wire bonding methods that are currently used in packaging integrated circuit chips. In one form of the TAB process, an integrated circuit chip is directly bonded to a foil-type lead frame that is usually rolled in about 0.08 mm in thickness. The inner ends of the leads that were etched into the foil tape are bonded to the solder bumps on the integrated circuit chips by a thermal compression method.

The integrated circuit chip is then encapsulated in plastic in an injection molding process leaving the outer ends of the leads exposed to the outside of the integrated circuit. The encapsulated integrated circuit and the exposed leads can then be excised out of the tape for connection to a circuit board. We shall use the term an integrated circuit module to describe an encapsulated TAB integrated circuit and its exposed leads.

In an encapsulated TAB integrated circuit module, the integrated circuit chip itself is well protected by the encapsulating plastic. However, the leads which are formed of tin plated copper foil are exposed for necessary connection to a circuit board. The dimensions of these leads which are approximately 0.3 mm wide, 0.08 mm thick, and 5 mm long make them very fragile and susceptible to damages during manufacturing and assembly. The fact that these leads are closely spaced together and in close proximity to the encapsulated chip make them almost impossible to repair once they are damaged.

It is therefore an object of the present invention to provide an integrated circuit package for surface mounting wherein the package leads to the integrated circuit chip are protected from deformation and damage during the manufacturing and assembly process.

It is another object of the present invention to provide an integrated circuit package for surface mounting wherein the leads to the integrated circuit chip can be formed into desirable shapes to be connected to a circuit board in a latter process and can be protected from deformation and damages during such process.

SUMMARY OF THE INVENTION

The present invention involves a surface mountable integrated circuit package formed by nesting an encapsulated TAB integrated circuit module between or two protective collars and snapping them together. We may refer to an integrated circuit package as an integrated circuit carrier. The protective collars may also be referred to as rings or protective members.

In our novel invention, integrated circuit chips are first bonded by a TAB process (tape automated bonding) and then encapsulated in plastic forming an integrated circuit module. In the next processing step, this module is excised out of the copper foil tape in order to be tested or mounted to a circuit board. These integrated circuit packages have very closely spaced external leads which may be subjected to unwanted deformation and damage before they are used on a circuit board. In our novel invention, a lead-forming protective member is affixed to an integrated circuit module over the external leads and forming the leads to a desirable shape by a specially designed contoured end on the protective member. The protective member has recessed areas on the inner surface to house the external leads and to keep them separated. The external leads contact at least one edge of the inner surface and closely wrap around the adjacent end of the protective member such that the external leads are conforming to the shape of the contoured end of the protective member.

The process of affixing the lead forming and protective member to an integrated circuit module can be performed in either one of two ways. First, a lower forming anvil having a recessed cavity may be used as a forming die such that when a protective member is mounted on the integrated circuit module and pushed down into the forming die, the ends of the external leads are wrapped around the contoured surface of the adjacent end of the protective member. An integrated circuit module assembly thus formed may be soldered down as a surface mount device. The lead forming and protective member may then be removed from the integrated circle module, if desired, so that the soldered leads may be inspected and if needed, repaired.

In an alternate method, the lower forming anvil is replaced by a second lead forming and protective member of a size larger than the first member in such a way so that when the first protective member is pushed down onto an integrated circuit module, the first member will nest into the second member while simultaneously locking the module in place. The inner surface of the second protective member acts as a forming die so that the ends of the external leads can be wrapped around on the forming edge of the first protective member. After the first protective member, the second protective member and the module are locked together into an integrated circuit module assembly, it can be soldered to a circuit board as a surface mount device. Additionally, both the first member and the second member may be slipped off the top of the integrated circuit module after mounting to a circuit board, if desired, to expose soldered external leads so that they can be inspected and/or repaired. We have conveniently described the first protective member as a locating ring and the second protective member as a retainer ring. Both members are injection molded of a thermoplastic material.

BRIEF DESCRIPTION OF DRAWINGS

Other objects, features and avantages of the present invention will become apparent upon consideration of the specification and the appended drawings, in which:

FIG. 9 is an elevational view of the outer protective ring and the inner protective ring in a snapped together position having the integrated circuit module nested in between.

DETAILED DESCRIPTION OF THE PREFERRED EMBODIMENT

The practice of the present invention of forming an integrated circuit package by snapping either one or two protective rings onto an integrated circuit module is described in the following two preferred embodiments.

Figure 1:
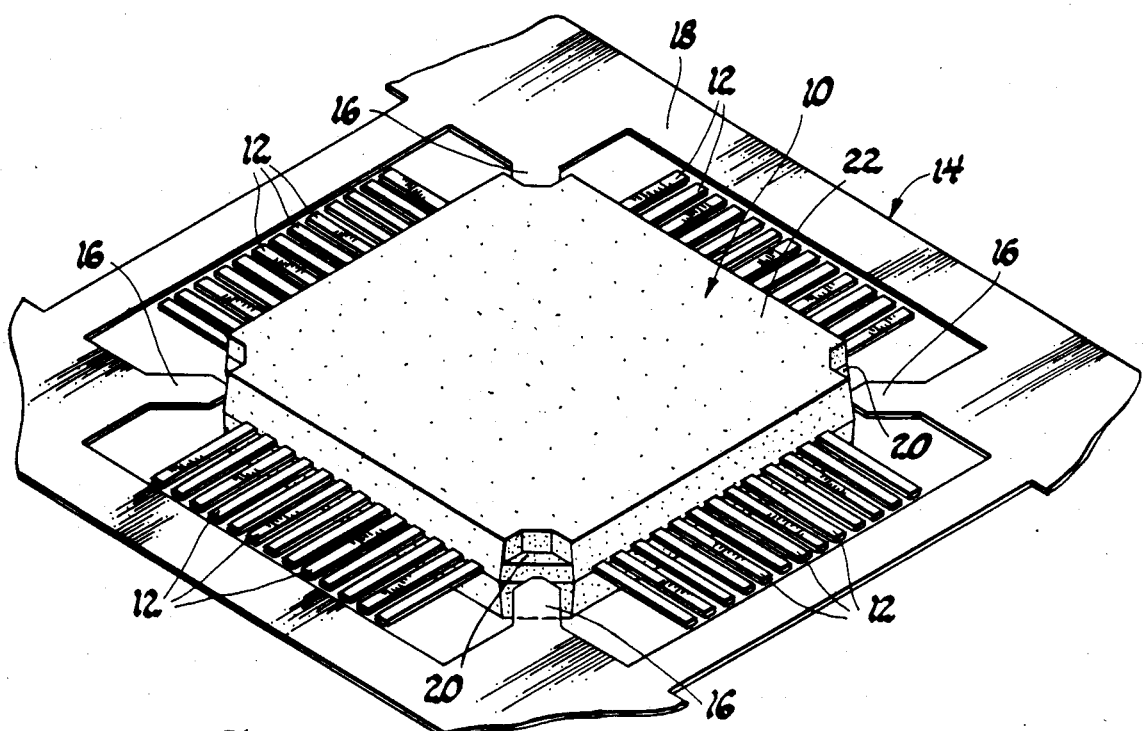
FIG. 1 is a perspective view of an integrated circuit module.

Referring initially to FIG. 1 where an encapsulated TAB (tape automated bonding) integrated circuit module 10 is shown. The external leads 12 of the integrated circuit module have been severed from the copper foil tape 14 except at the corner tabs 16. The surface 18 of our copper foil tape 14 was coated with tin. At each corner of the integrated circuit module 10, a recess 20 is formed from the surface 22 of the module. Note that the external leads 12 are closely spaced together and in close proximity to the body portion of the encapsulated TAB module 10. The corner tabs 16 are normally dummy leads which are not connected to the circuits of the integrated circuit chip. The corner tabs 16 are used to physically support the module 10 so that testing or other processing steps such as plastic encapsulation can be performed on the module.

Figure 2:
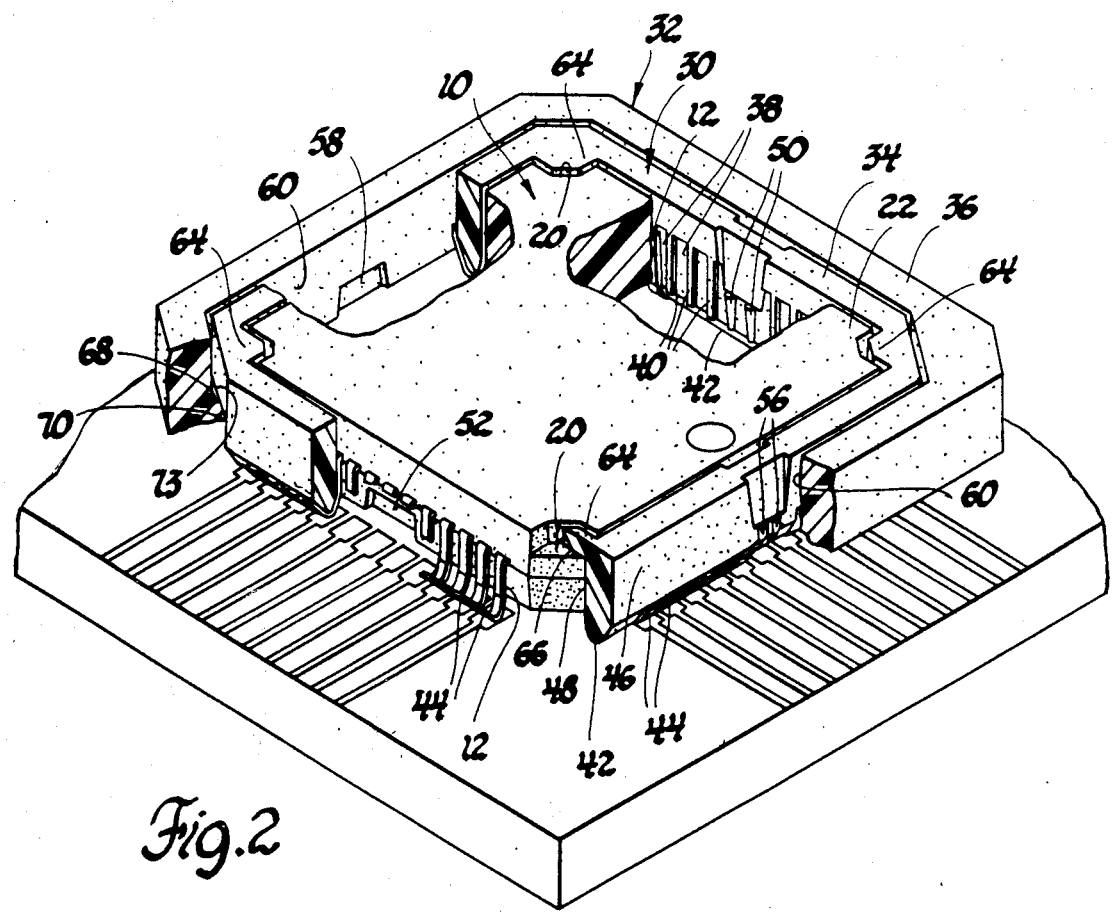
FIG. 2 is a perspective cutaway view of an encapsulated TAB integrated circuit module having an inner protective member and an outer protective member installed thereon. The module is positioned on a circuit board.

FIG. 2 shows the same encapsulated tab integrated circuit module 10 having a flexible plastic inner protective ring (locater ring) 30 and a flexible plastic outer protective ring (retainer ring) 32 mounted thereon. Note that the top surface 34 of the locating ring 30 and the top surface 36 of the retainer ring 32 are substantially flush with the top surface 22 of the module 10 after the three parts are snapped together in an assembled position. On the inner surface of locating ring 30, a series of recessed areas 38 are provided to house external leads 12 such that they are mutually separated by ledges 40. The external leads 12 contact the contoured end 42 of locating ring 30. Note that ends 44 of the external leads 12 are wrapped around the contoured end 42 of locating ring 30 to contact the outer surface 46 when retainer ring 32 is mounted on the outside of locating ring 30. The recessed areas 38 on the inner surface of the locating ring keeps the ends 44 of the external leads at a predetermined distance from each other so that they are separated. Built-in latches 50 centrally located on the inside surface of locating ring 30 latches onto recessed area 52 also centrally located on TAB module 10 at each of the four sites. The locking engagement between latches 50 and recessed areas 52 prevent the TAB module 10 and the locating ring 30 from easy separation. However, the two parts can still be separated when desired by using a suitable amount of force to temporarily bend the flexible plastic parts, and release the latches. This occurs in a situation where external leads 12 must be exposed so that they can be inspected after being soldered down to a circuit board.

In FIG. 2, built-in latches 56 centrally located on the outer surface of locating ring 30 provide a locking action between locating ring 30 and retainer ring 32 by engaging the recessed areas 58 centrally located on each side of inner surface 60 of retainer ring 32. At each corner of locating ring 30, a stop 64 is provided such that the surface 66 of the stops engages the surface 70 of the recessed area located at each corner of the TAB module 10. Stops 64 at each corner fix the position of locating ring 30 relative to the position of TAB module 10. It should be noted that while latches 50 provide locking action between locating ring 30 and TAB integrated circuit module 10, they also function as ledges such as 40 for the separation of the external leads. It should also be noted that while our specific embodiment shows latches 50 centrally located on each side of locating ring 30, they may be suitably located anywhere on the inside surface 60 of locating ring 30 and function equally well. For instance, we have used locating rings having the latches at each corner of the ring and obtained satisfactory results.

Figure 3:
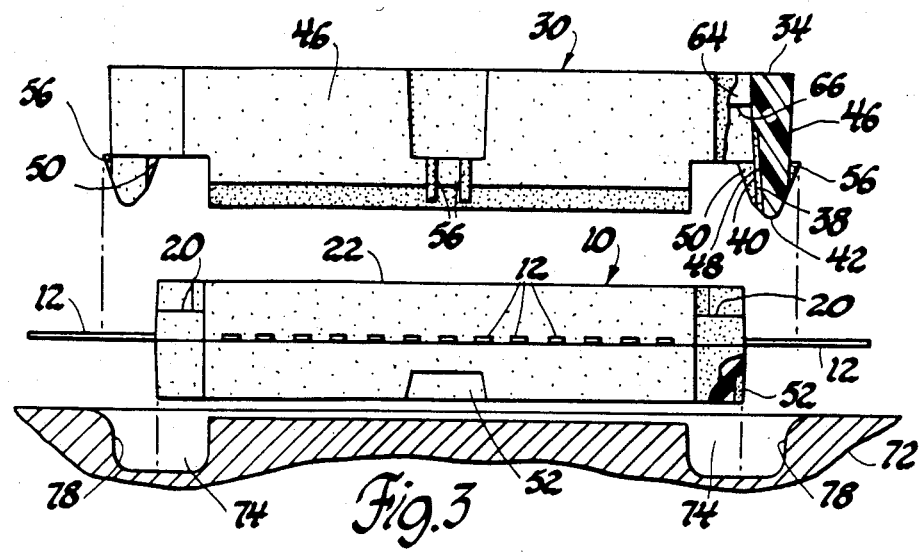
FIG. 3 is a schematic view showing an outer protective ring (locating ring) positioned over an integrated circuit module and a lower die.

FIG. 2 illustrates our first preferred embodiment in which both an inner protective ring and an outer protective ring were used. In our second preferred embodiment, a forming anvil instead of the outer protective ring is used to form the ends of the external leads into desirable shapes. A schematic of this second preferred embodiment in a partially cutaway view is shown in FIG. 3. A forming anvil 72 having a cavity 74 is used in place of retainer ring 32 shown in FIG. 2. When locating ring 30 is pushed down on TAB integrated circuit module 10 into the forming anvil 72, the external leads 12 are wrapped around the inner surface 48, the contoured end 42 and the outer surface 46 of locating ring 30. The inner surface 78 of forming anvil 72 helps to shape the external leads 12 into a predetermined shape.

Figure 4:
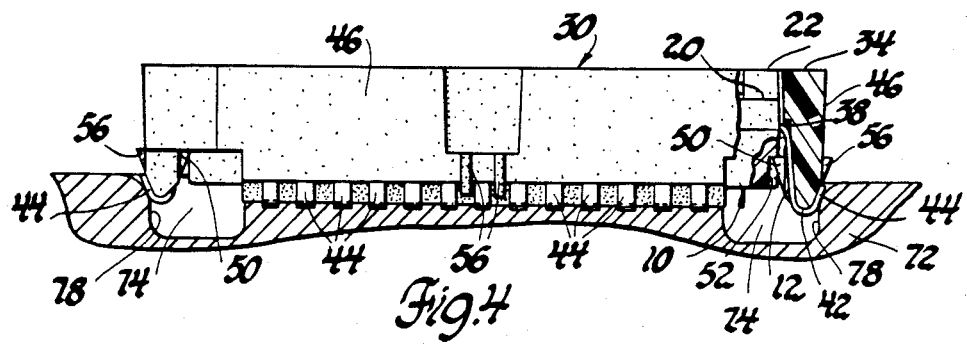
FIG. 4 is a schematic view showing the integrated circuit module being pushed down into the lower die by the outer protective ring in a forming position for the external lead ends.
Figure 5:
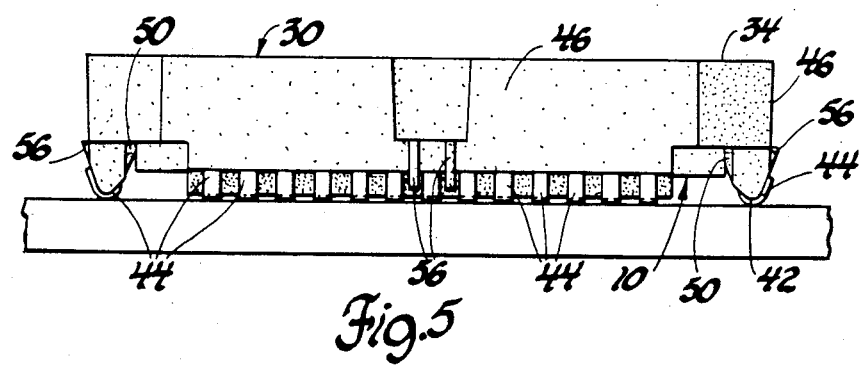
FIG. 5 is a schematic view of the integrated circuit module with the outer protective ring mounted thereon.
Figure 6:
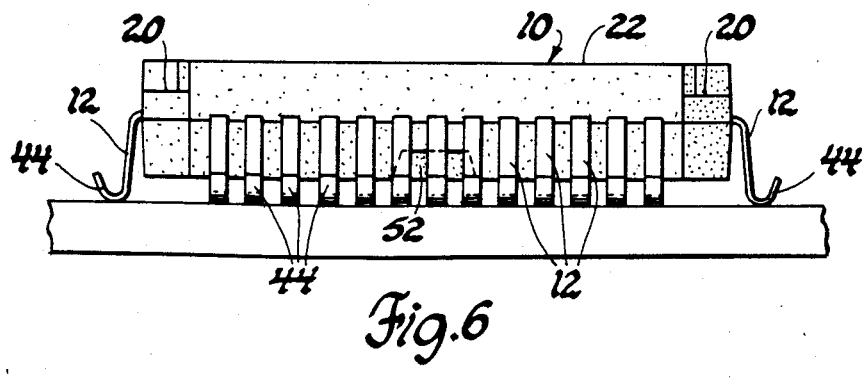
FIG. 6 is a schematic view showing the integrated circuit module and its formed external leads after the outer protective ring has been removed.

FIG. 4 is a schematic showing the locating ring 30, the TAB integrated circuit module 12, and the forming anvil 72 in a forming position. Note that ends 44 of external leads 12 are wrapped around the contoured end 42 of the locating ring when the external leads 12 are pushed into forming die 74. FIG. 5 shows an assembly of locating ring 30 and TAB integrated circuit module 10 after they are removed from forming anvil 72. The locating ring 30 may optionally be removed after soldering to a circuit board from TAB integrated circuit module 10 to expose the external leads 12 so that inspection and/or repair can be performed. This is shown in FIG. 6.

Figure 7:
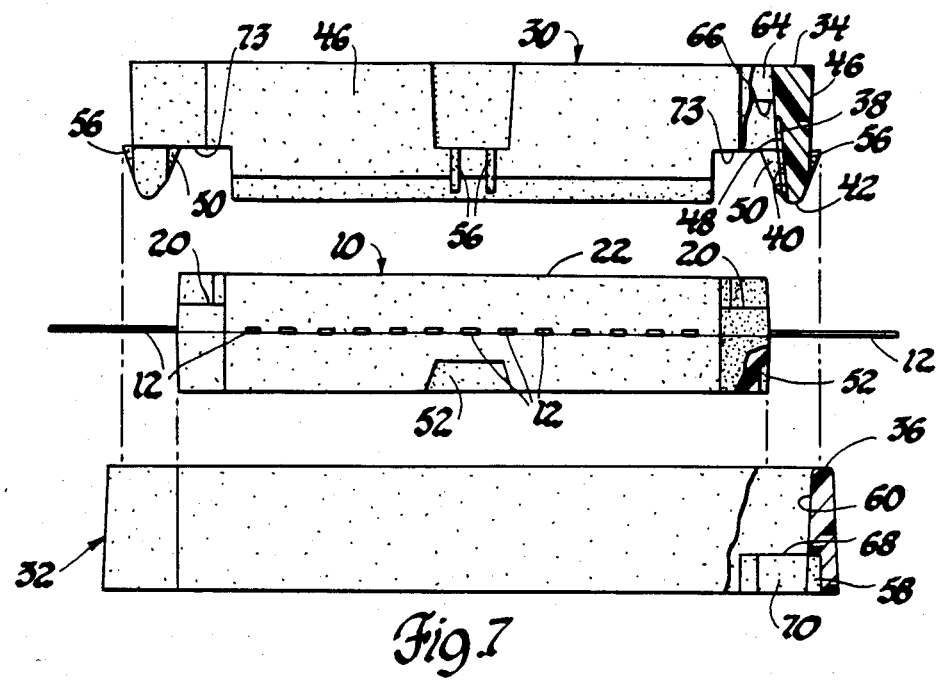
FIG. 7 is a schematic view showing an integrated circuit module positioned between an outer protective ring and an inner protective ring.
Figure 8:
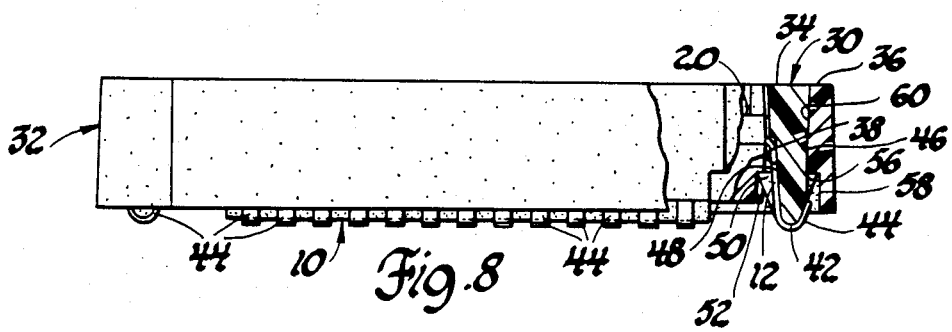
FIG. 8 is a schematic view showing the outer protective ring and the inner protective ring in a snapped together position with the integrated circuit module nested therein.
Figure 9:
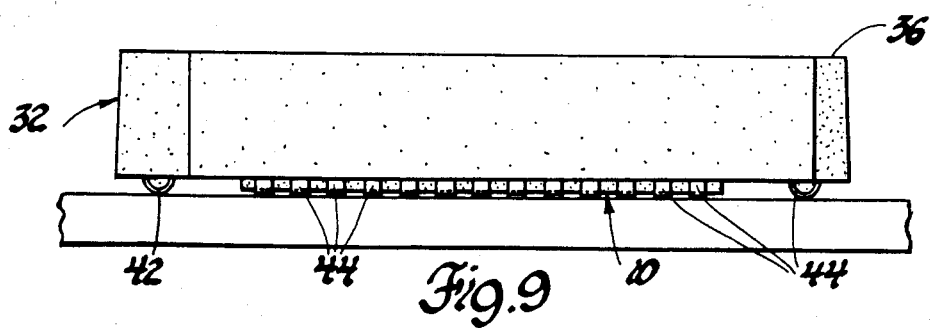
Figure 10:
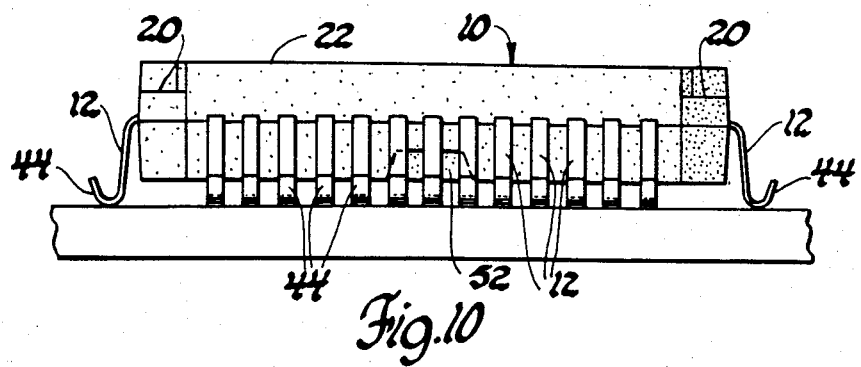
FIG. 10 is a schematic view showing the integrated circuit module with the external leads in a formed position after the inner and the outer protective rings are removed.

The assembly procedure of our first preferred embodiment is shown in FIGS. 7 thru 10. A partially cutaway perspective view of this preferred embodiment is also shown in FIG. 2. FIG. 7 shows locating ring 30, TAB integrated circuit module 10 with external leads 12 exposed, and retainer ring 32 in a preassembled position. When locating ring 30 is pushed down onto module 10 and retainer ring 32, the contoured end 42 and latches 50 and 56 perform the necessary forming action on the external leads 12 by wrapping the external leads 12 around latch 56 on the external surface of locating ring 30. As locating ring 30 is pushed down fully into the retainer ring 32, locating ring 30 is locked into retainer ring 32 by the engagement of latches 56 and 50 with the recessed areas 58 and 52, respectively. This is shown in FIG. 8. FIG. 9 is a front view of an assembled integrated circuit package in which the locating ring and the retainer ring are snapped together with the TAB integrated circuit module nested in between. It is to be noted that the locking action provided between the latches and the recesses, i.e., latches 50 and 56 on locating ring 30 and recesses 52 and 58 on module 10 and retainer ring 32, may be released by pulling the retainer ring and the locating ring together upward. A TAB integrated circuit module 10 having its external leads 12 formed into a desirable shape such that they may be soldered down to a circuit board is shown in FIG. 10. It is also to be noted that during the process of assembly (FIG. 7) where the locating ring 30 is pushed down into the retainer ring 32, the advancement of locating ring 30 is stopped when surface 66 on stops 64 on the locating ring is bottomed out on surface 70 of stops 20 on the TAB integrated circuit module 10. The further advancement of module 10 and locating ring 30 into retainer ring 32 is stopped when stops 72 located at each corner of locating ring 30 engage stops 70 located at each corner of retainer ring 32 on surface 68.

Figure 11:
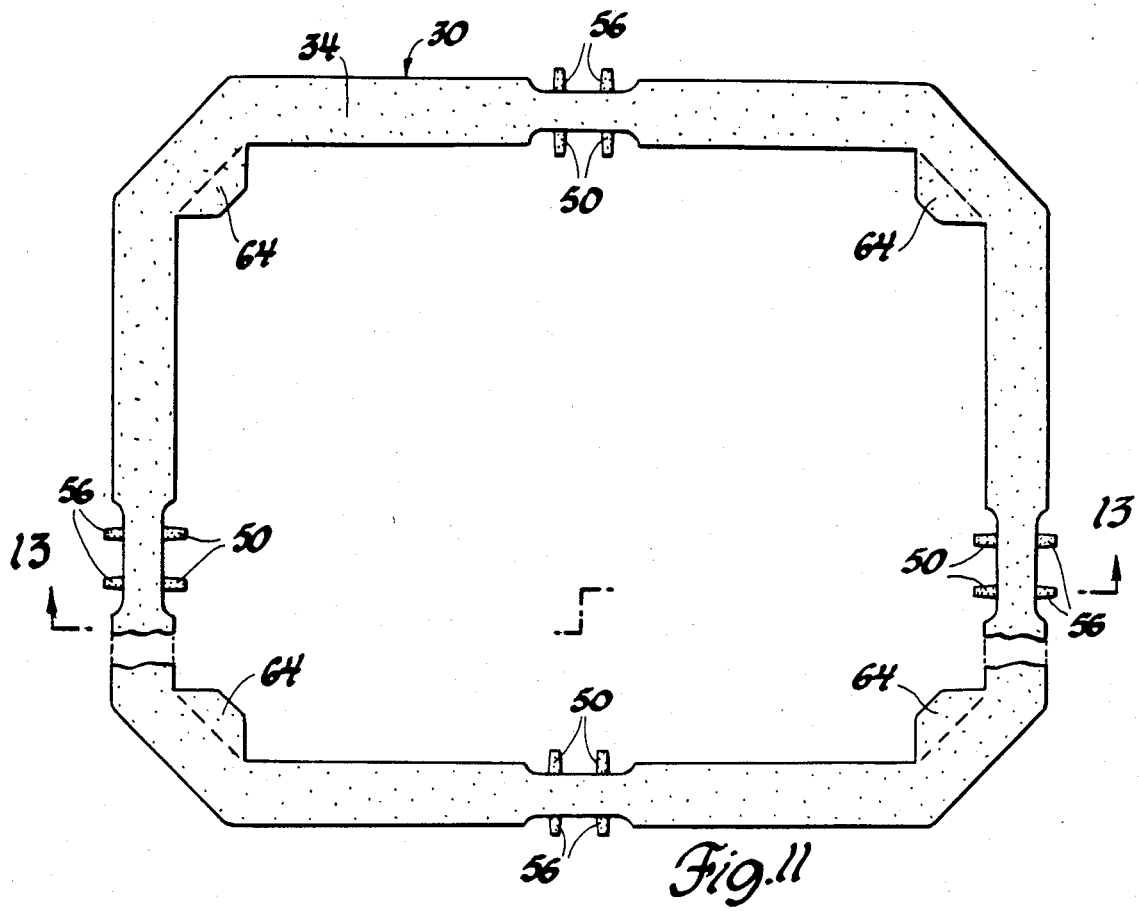
FIG. 11 shows a top plan view of the inner protective ring.
Figure 12:
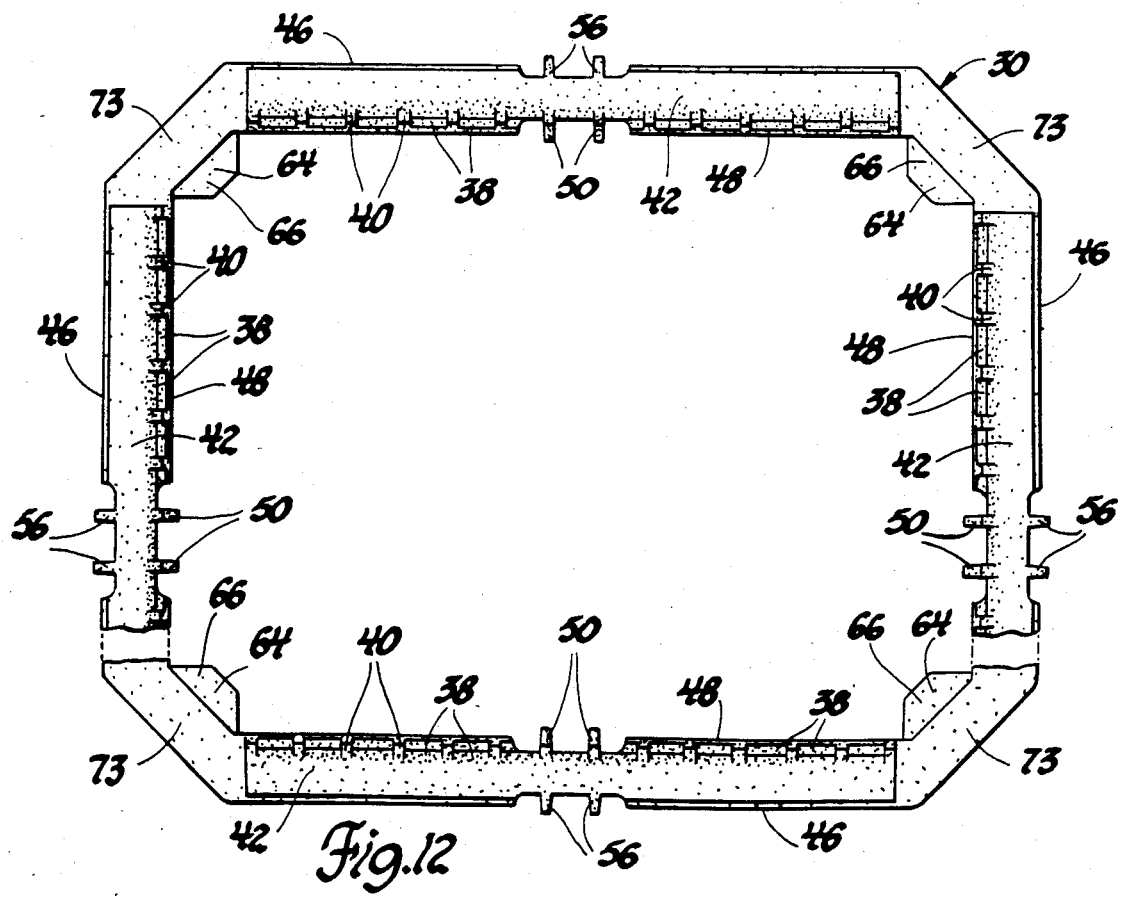
FIG. 12 is a bottom plan view of the inner protective ring.
Figure 13:
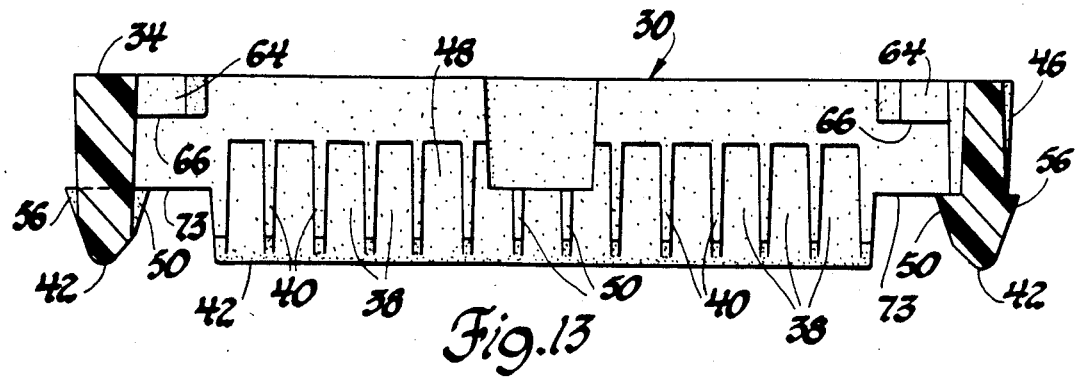
FIG. 13 is a cross-sectional view taken substantially along line 13—13 in FIG. 11.
Figure 14:
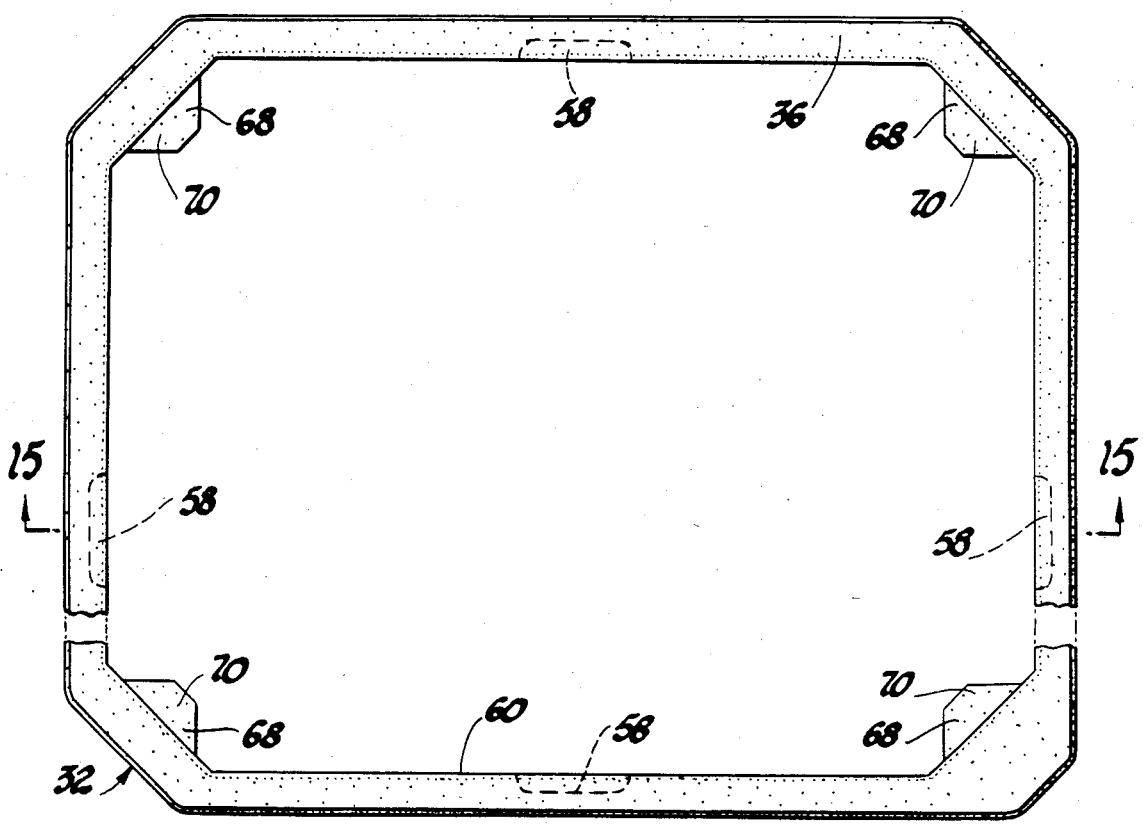
FIG. 14 is a top plan view of the outer protective ring (retainer ring).
Figure 15:
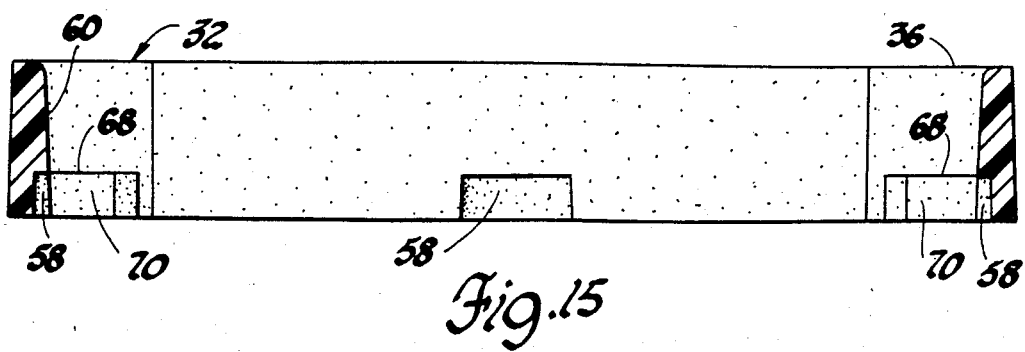
FIG. 15 is a cross-sectional view taken along line 15—15 in FIG. 14.

FIG. 11 shows a plain view of locating ring 30. Note the position of latches 50 and 56 which are located on the interior wall and the exterior wall respectively. FIG. 12 is a bottom view of retainer ring 30. Note the positions of recessed areas 38 for the external leads and latches 40 separating the recessed areas. FIG. 13 is a cross-sectional view taken subtantially along line 13—13 in FIG. 11. FIG. 14 shows a plain view of retainer ring 32. Note the recessed areas 58 for the engagement of latches 56 located on locating ring 30. FIG. 15 is a cross-sectional view taken along line 15—15 in FIG. 14.

While our invention has been described in terms of two preferred embodiments thereof, it is to be appreciated that those skilled in the art will readily apply these teachings to other possible variations of the invention.

The embodiments of the invention in which an exclusive property or privilege is claimed are defined as follows:

1. In an integrated circuit package having closely spaced external leads subject to unwanted deformation before use, the improvement comprising a lead-forming and protective member made of a nonconductive material affixed to said package over said leads and cooperating with conformations on said leads to retain the leads in predetermined disposition, said protective member having a surface facing the package and projections on that surface for maintaining the leads mutually separated, said external leads contacting at least one edge of that surface and closely wrapping around an adjacent end of said protective member to provide conformation on said external leads such that the leads engage the adjacent end of the protective member to enhance resistance to unwanted deformation.

2. A semiconductor integrated circuit package having a first supplementary member affixed thereto for forming package leads into a predetermined configuration and for protecting that conformation once so formed, said first supplementary member having on the body a surface facing the package and projections on that surface to space package leads, an edge of the surface in contact with said package leads and package leads wrapped around an end of said first supplementary member onto an opposite face of said member, effective to provide a physical engagement between said first supplementary member and said package leads such that said first supplementary member not only shapes said package leads into a predetermined conformation but helps retain them in that conformation once so formed, said integrated circuit package contains a second supplementary member having on the body an inner surface opposing and frictionally engaging the ends of said formed package leads, effective to be removably mounted on said first supplementary member to shield the ends of said formed package leads from unwanted deformation and damage.

3. In an integrated circuit chip carrier having closely spaced external leads wherein the improvement comprises an inner and an outer surrounding collar for forming, nesting and protecting the leads, said inner collar comprising an annular body member, a plurality of projections on an inner face of said collar providing recesses for the leads, carrier leads nested in the recesses, carrier leads contacting the inner face of the annulus at least at one edge thereof and extending closely around an end of said inner collar into the interfacial area between said inner and outer collars, effective to provide an improved conformation on said carrier leads and a physical engagement with said collar end to provide an entrapment for the carrier lead free ends, said outer surrounding collar comprising an annular body member having an inner surface opposing and frictionally engaging the free ends of said carrier leads, stops at each inner corner to engage said inner surrounding collar such that said outer surrounding collar may be removably mounted on the outer face of said inner surrounding collar to completely shield the free ends of said carrier leads from unwanted deformation and damage.

* * * * *